(12) United States Patent
Goto

(10) Patent No.: US 8,817,149 B2
(45) Date of Patent: Aug. 26, 2014

(54) SOLID-STATE IMAGING DEVICE AND IMAGING APPARATUS

(71) Applicant: FUJIFILM Corporation, Tokyo (JP)

(72) Inventor: Takashi Goto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/732,988

(22) Filed: Jan. 2, 2013

(65) Prior Publication Data
US 2013/0113972 A1  May 9, 2013

Related U.S. Application Data

(63) Continuation of application No. 13/109,507, filed on May 17, 2011, now Pat. No. 8,368,788.

(30) Foreign Application Priority Data

May 18, 2010 (JP) .................. 2010-114398
May 11, 2011 (JP) .................. 2011-106318

(51) Int. Cl.
*H04N 3/14* (2006.01)
*H04N 5/335* (2011.01)

(52) U.S. Cl.
USPC ........... 348/294; 348/298; 348/302; 348/308; 348/312

(58) Field of Classification Search
USPC ......... 348/294–324; 250/208.1; 257/290–292
See application file for complete search history.

(56) References Cited

U.S. PATENT DOCUMENTS

| | | |
|---|---|---|
| 2003/0214598 A1 | 11/2003 | Shizukuishi |
| 2005/0224841 A1 | 10/2005 | Nakamura et al. |
| 2006/0267054 A1 | 11/2006 | Martin et al. |
| 2007/0285545 A1 | 12/2007 | Hsieh |
| 2007/0291144 A1 | 12/2007 | Suzuki |
| 2008/0225133 A1* | 9/2008 | Takayanagi et al. ....... 348/222.1 |
| 2010/0309357 A1 | 12/2010 | Oike |

FOREIGN PATENT DOCUMENTS

| | | |
|---|---|---|
| EP | 1492334 A1 | 12/2004 |
| EP | 2262226 A1 | 12/2010 |
| JP | 2000-297068 A | 10/2000 |
| JP | 2007-103786 A | 4/2007 |
| JP | 4213832 B2 | 11/2008 |

OTHER PUBLICATIONS

Extended European Search Report; EP No. 11166347.2-2203; Sep. 15, 2011.

* cited by examiner

*Primary Examiner* — Yogesh Aggarwal
(74) *Attorney, Agent, or Firm* — Studebaker & Brackett PC

(57) ABSTRACT

A solid-state imaging device includes a photoelectric conversion layer, a MOS transistor circuit. The photoelectric conversion layer is formed over a semiconductor substrate. The MOS transistor circuit reads out a signal corresponding to charges generated in the photoelectric conversion layer and then collected, and that is formed in the semiconductor substrate, the charges having a given polarity. The MOS transistor circuit includes a charge accumulation portion, a reset transistor, and an output transistor. The charge accumulation portion is electrically connected with the photoelectric conversion layer. The reset transistor resets a potential of the charge accumulation portion to a reset potential. The output transistor outputs a signal corresponding to the potential of the charge accumulation portion. The reset transistor and the output transistor have carriers whose polarity is opposite to the given polarity. In the MOS transistor circuit, following formula (1) is satisfied: $GND < Vs < GND + \Delta V2 + (Vdd/5) \ldots$ (1).

10 Claims, 8 Drawing Sheets

RESET "ON"

RESET "OFF"

SIGNAL ACCUMULATION

SATURATION STATE

SOLID-STATE IMAGING DEVICE AND IMAGING APPARATUS

CROSS-REFERENCE TO RELATED APPLICATIONS

This application is a Continuation of U.S. patent application Ser. No. 13/109,507 (filed on May 17, 2011) which claims the benefit of Japanese Patent Application Nos. 2010-114398 (filed on May 18, 2010), and 2011-106318 (filed on May 11, 2011), the entire contents of which are hereby incorporated by reference.

BACKGROUND

1. Technical Field

The present invention relates to a solid-state imaging device and an imaging apparatus.

2. Related Art

JP-A-2007-103786 discloses a solid-state imaging device wherein the lights of "B" (blue) and "R" (red) are detected by a photodiode within a silicon substrate, while the light of "G" (green) is detected by a photoelectric converter over the silicon substrate.

In the solid-state imaging device, regarding the photoelectric converter over the silicon substrate, holes among charges generated in a photoelectric conversion layer are accumulated in a pixel electrode, and a signal corresponding to the accumulated holes is read out by a signal readout circuit which is formed of an n-channel MOS transistor. In the solid-state imaging device, regarding the photodiode within the silicon substrate, electrons among charges generated here are accumulated, and a signal corresponding to the electrons is read out by a signal readout circuit which is formed of an n-channel MOS transistor.

In accordance with the solid-state imaging device, regarding the photoelectric converter over the silicon substrate, the holes generated in the photoelectric conversion layer are used as the charges for the signal readout, whereby a sensitivity to the G light can be enhanced by making low a probability at which the charges generated in the photoelectric conversion layer are annihilated during the movements thereof within the photoelectric conversion layer, and a probability at which the charges are trapped by trap levels.

On the other hand, as to the B light and the R light, the charges need to be processed within the silicon substrate, and hence, the electrons which are higher in mobility than the holes are used as the charges for the signal readout. Thus, probabilities at which the electrons generated in correspondence with the B light and the R light are annihilated during the movements thereof can be made low, and also sensitivities to the R light and the B light can be prevented from lowering.

In general, the wide dynamic range is required for a solid-state imaging device and is also required in a solid-state imaging device stated in JP-A-2007-103786. However, the dynamic range enlargement is not stated in JP-A-2007-103786. Especially, a photoelectric-conversion-layer-stack-type solid-state imaging device which pulls out holes as charges for signal from the photoelectric converter over the silicon substrate, like the solid-state imaging device in JP-A-2007-103786, includes a readout circuit which is different from a readout circuit of a photoelectric converter using a general photo diode in a silicon substrate which pulls out electrons as charges for signal. For this reason, a devisal for the dynamic range enlargement is required.

SUMMARY OF INVENTION

An object of the present invention is to provide a photoelectric-conversion-layer-stack-type solid-state imaging device and an imaging apparatus which can realize a high sensitivity and a wide dynamic range.

According to an aspect of the invention, a solid-state imaging device includes a photoelectric conversion layer, a MOS transistor circuit. The photoelectric conversion layer is formed over a semiconductor substrate. The MOS transistor circuit reads out a signal corresponding to charges generated in the photoelectric conversion layer and then collected, and that is formed in the semiconductor substrate, the charges having a given polarity. The MOS transistor circuit includes a charge accumulation portion, a reset transistor, and an output transistor. The charge accumulation portion is electrically connected with the photoelectric conversion layer. The reset transistor resets a potential of the charge accumulation portion to a reset potential. The output transistor outputs a signal corresponding to the potential of the charge accumulation portion. The reset transistor and the output transistor have carriers whose polarity is opposite to the given polarity. In the MOS transistor circuit, following formula (1) is satisfied:

$$GND < Vs < GND + \Delta V2 + (Vdd/5) \tag{1}$$

where GND denote a reference potential of all potentials, Vs denote the reset source voltage, and $\Delta V2$ denote a difference between a first potential of the charge accumulation portion in a case where the reset transistor is in its ON state and a second potential of the charge accumulation portion immediately after the reset transistor has turned from its ON state into its OFF state.

The imaging apparatus of the present invention includes the solid-state imaging device stated above.

DETAILED DESCRIPTION

Now, a solid-state imaging device 100 in an embodiment of the present invention will be described with reference to the drawings. The solid-state imaging device 100 is used in a state where it is mounted in, for example, an imaging apparatus such as a digital camera or a digital video camera, or an imaging module which is mounted in an electronic endoscope, a mobile phone with a camera, or the like.

Figure 1:
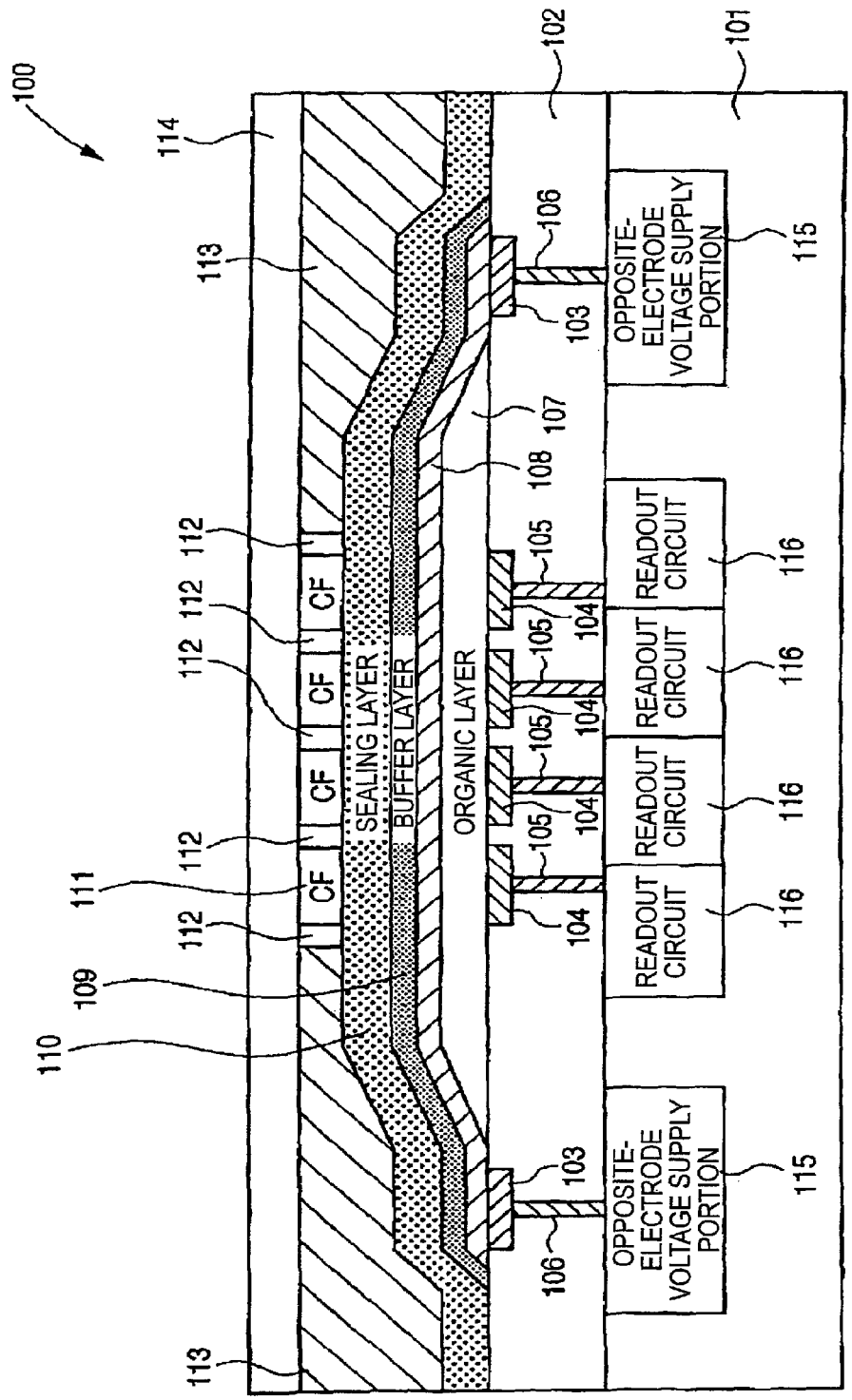
FIG. 1 is a sectional model view showing the schematic configuration of a solid-state imaging device in an embodiment of the present invention.

The solid-state imaging device 100 shown in FIG. 1 includes a substrate 101, an insulating layer 102, connection electrodes 103, pixel electrodes 104, connection portions 105, connection portions 106, an organic layer 107, an opposite electrode 108, a buffer layer 109, a sealing layer 110, color filters 111, partition walls 112, a light shield layer 113, a protective layer 114, opposite-electrode voltage supply portions 115, and readout circuits 116.

The substrate 101 is a semiconductor substrate of silicon or the like. The insulating layer 102 is formed on the substrate 101. The plurality of pixel electrodes 104 and the plurality of connection electrodes 103 are formed in the front surface of the insulating layer 102.

The organic layer 107 is formed including at least a photoelectric conversion layer. The photoelectric conversion layer is a layer formed of a photoelectric conversion material which generates charges in correspondence with received light. The organic layer 107 is disposed on the plurality of pixel electrodes 104 in a manner to cover them.

The organic layer 107 has a fixed thickness on the pixel electrodes 104, but even when its thickness changes at parts outside a pixel portion (outside an effective pixel region), no problem is posed. Incidentally, the organic layer 107 includes, not only one formed of a layer which is made of only an organic material, but also one formed of a layer which partly contains an inorganic material.

The opposite electrode 108 is an electrode opposing to the pixel electrodes 104, and it is disposed on the organic layer 107 in a manner to cover this layer. Besides, the opposite electrode 108 is formed of a conductive material which is transparent to input light, in order to enter the light into the organic layer 107. Further, the opposite electrode 108 is formed even on the connection electrodes 103 arranged outside the organic layer 107 and is electrically connected with the connection electrodes 103.

The connection portions 106 are buried in the insulating layer 102, and each of them is a plug or the like for electrically connecting the connection electrode 103 and the opposite-electrode voltage supply portion 115. The opposite-electrode voltage supply portions 115 are formed in the substrate 101, and they apply a predetermined voltage to the opposite electrode 108 through the connection portions 106 and the connection electrodes 103. In a case where a voltage to be applied to the opposite electrode 108 is higher than the power source voltage Vdd of the solid-state imaging device 100, the predetermined voltage is supplied in such a way that the power source voltage Vdd is raised by a charge pump or the like boost circuit.

The pixel electrodes 104 are charge collection electrodes for collecting charges generated in the organic layer 107 which is interposed between these pixel electrodes 104 and the opposite electrode 108 opposing thereto.

The readout circuits 116 are disposed in the substrate 101 so as to correspond respectively to the plurality of pixel electrodes 104, and they read out signals corresponding to the charges collected by the corresponding pixel electrodes 104.

The readout circuits 116 are configured of circuits each of which includes a MOS (Metal-Oxide-Semiconductor) transistor formed in the substrate 101, and they are shielded from light by a light shield layer, not shown, arranged in the insulating layer 102. The details of the readout circuits 116 will be stated later.

The buffer layer 109 is formed on the opposite electrode 108 in a manner to cover this opposite electrode 108. The sealing layer 110 is formed on the buffer layer 109 in a manner to cover this buffer layer 109. The color filters 111 are formed at positions on the sealing layer 110 as oppose to the respective pixel electrodes 104. The partition walls 112 are disposed between the adjacent color filters 111, and they serve to enhance the light collection efficiency of the color filters 111.

The light shield layer 113 is formed on the sealing layer 110 except a region where the color filters 111 and the partition walls 112 are disposed, and it prevents light from entering into the organic layer 107 formed outside the effective pixel region.

The protective layer 114 is formed on the color filters 111, the partition walls 112 and the light shield layer 113, and it protects the whole solid-state imaging device 100.

By the way, in the example of FIG. 1, the pixel electrodes 104 and the connection electrodes 103 are in the form in which they are buried in the front surface part of the insulating layer 102, but they may well be formed on the insulating layer 102. Besides, the plurality of sets each consisting of the connection electrode 103, the connection portion 106 and the opposite-electrode voltage supply portion 115 are disposed, but only one set may well be disposed. The voltage is supplied from both the end parts of the opposite electrode 108 to this opposite electrode 108 as in the example of FIG. 1, whereby a voltage drop in the opposite electrode 108 can be suppressed. The number of the sets may be properly increased or decreased in consideration of the chip area of the device.

The solid-state imaging device 100 has the plurality of pixel portions. The plurality of pixel portions are arrayed in the form of two dimensions in a state where the substrate 101 is viewed in plan from the input side of the light. The pixel portion includes a photoelectric converter, which includes the pixel electrode 104, the organic layer 107 and the opposite electrode 108 opposing to the pixel electrode 104, the color filter 111 and the readout circuit 116.

Next, a configurational example of peripheral circuits will be described.

Figure 2:
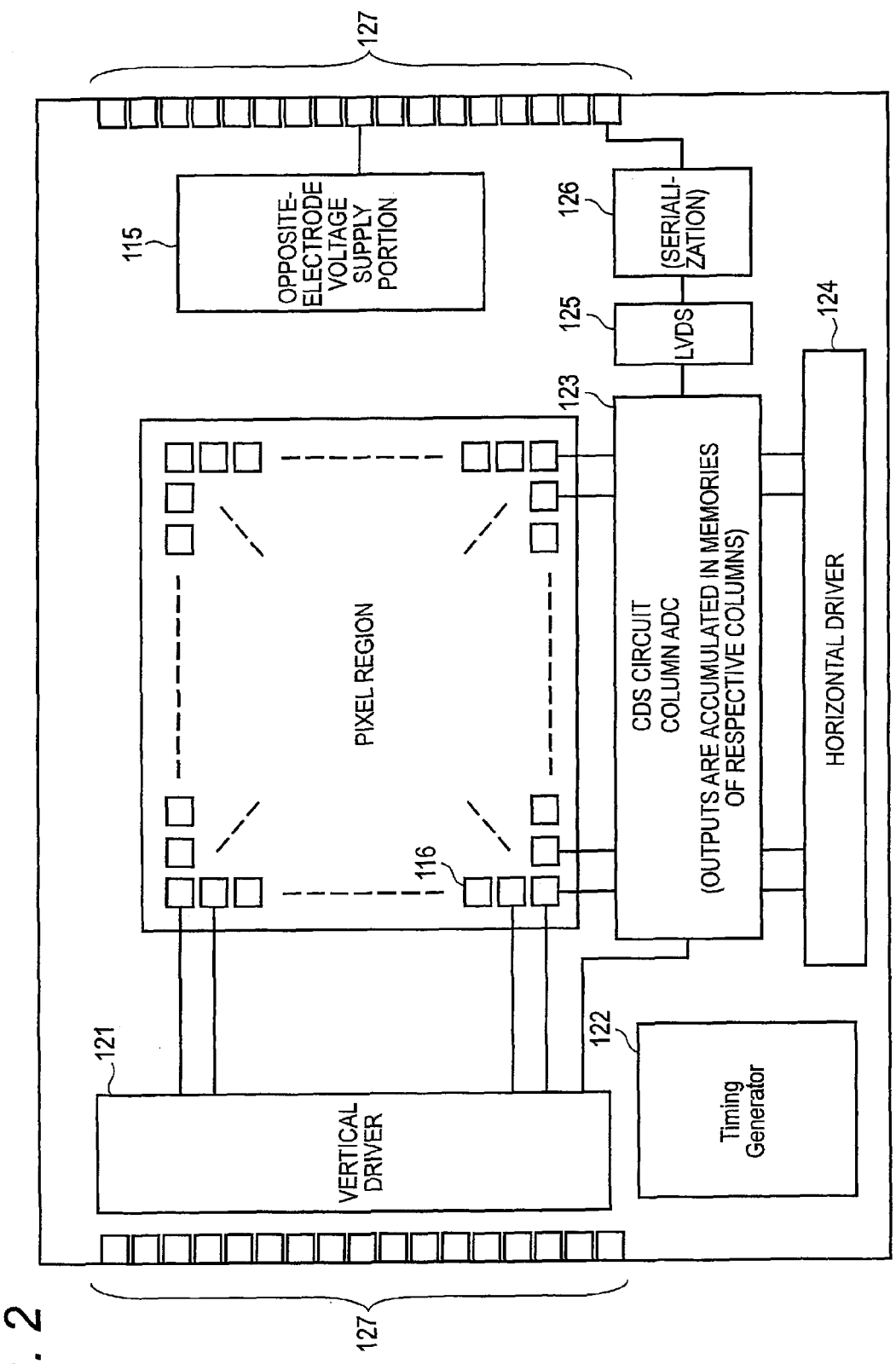
FIG. 2 is a diagram showing an example of the whole configuration which includes the peripheral circuits of the solid-state imaging device shown in FIG. 1.

FIG. 2 is a diagram showing an example of the whole configuration which includes the peripheral circuits of the solid-state imaging device 100 shown in FIG. 1. As shown in FIG. 2, the solid-state imaging device 100 includes the configuration shown in FIG. 1, a vertical driver 121, a timing generator 122, a signal processing circuit 123, a horizontal driver 124, an LVDS circuit 125, a serialization portion 126, and pads 127.

Individual blocks within the pixel region shown in FIG. 2 represent the readout circuits 116. As the peripheral circuits of the solid-state imaging device 100, substantially the same circuits as peripheral circuits employed in a general MOS-type image sensor may be adopted.

The pads 127 are interfaces which are used for inputs from and outputs to the exterior.

The timing generator 122 supplies timing signals for driving the solid-state imaging device 100, thereby to perform also readout operations such as binning readout and partial readout.

The signal processing circuit 123 is disposed in correspondence with the respective columns of the readout circuits 116. Besides, the signal processing circuit 123 executes a correlated double sampling (CDS) process for signals outputted from the corresponding column, thereby to convert a processed signal into a digital signal. The signal after the process by the signal processing circuit 123 is stored in a memory which is disposed every column.

The vertical driver 121 performs controls for reading out signals from the readout circuits 116, etc.

The horizontal driver 124 performs a control for successively reading out signals for one row as are stored in the memories of the signal processing circuit 123, and for outputting the signals to the LVDS 125.

The LVDS circuit 125 transmits a digital signal in accordance with LVDS (low voltage differential signaling).

The serialization portion 126 serializes inputted parallel digital signals, and outputs the serialized signals.

Next, a preferable configurational example of the photoelectric conversion layer will be described.

The photoelectric conversion layer includes a p-type organic semiconductor and an n-type organic semiconductor. Forming a donor-acceptor interface by joining the p-type organic semiconductor and the n-type organic semiconductor can increase the exciton dissociation efficiency. Therefore, a photoelectric conversion layer in which the p-type organic semiconductor and the n-type organic semiconductor are joined to each other exhibits high photoelectric conversion efficiency. In particular, a photoelectric conversion layer in which the p-type organic semiconductor and the n-type organic semiconductor are mixed with each other is preferable because an increased junction interface area increases the photoelectric conversion efficiency.

The p-type organic semiconductor (compound) is a donor-type organic semiconductor and is an organic compound which tends to donate electrons as typified by a hole-transporting organic compound. More specifically, the p-type organic semiconductor is an organic compound having a lower ionization potential of two organic compounds when they are used being in contact with each other. Therefore, any electron-donating organic compound can be used as a donor-type organic semiconductor.

Usable examples are triarylamine compounds, benzidine compounds, pyrazoline compounds, stytrylamine compounds, hydrazone compound, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, and fluoranthene derivatives), and metal complexes having a nitrogen-containing heterocyclic compound as a ligand.

As described above, other organic compounds can also be used as a donor-type organic semiconductor as long as they have a lower ionization potential than an organic compound used as an n-type (acceptor-type) compound.

The n-type organic semiconductor (compound) is an acceptor-type organic semiconductor and is an organic compound which tends to accept electrons as typified by an electron-transporting organic compound. More specifically, the n-type organic semiconductor is an organic compound having higher electron affinity of two organic compounds when they are used being in contact with each other. Therefore, any electron-accepting organic compound can be used as an acceptor-type organic semiconductor.

Usable examples are condensed aromatic carbocyclic compounds (naphthalene derivatives, anthracene derivatives, phenanthrene derivatives, tetracene derivatives, pyrene derivatives, perylene derivatives, and fluoranthene derivatives), 3- to 5-membered heterocyclic compounds containing a nitrogen atom(s), an oxygen atom(s), and/or a sulfur atom(s) (e.g., pyridine, pyrazine, pyrimidine, pydazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotrizole, benzoxazole, benzothiazole, carbazole, purine, triazolopyridazine, triazolopyrimizine, tetrazainedene, oxadiazole, imidazopyridine, pyralizine, pyrrolopyridine, thiadiazolopyridine, dibenzazepine, and tribenzazepine), polyarylene compounds, fluorene compounds, cyclopentadien compounds, silyl compounds, and metal complexes having a nitrogen-containing heterocyclic compound as a ligand.

As described above, other organic compounds can also be used as a acceptor-type organic semiconductor as long as they have higher electron affinity than an organic compound used as a p-type (donor-type) compound.

Although any organic dyes can be used as a p-type or n-type organic semiconductor, preferable examples are a cyanine dye, a styryl dye, a hemicyanine dye, a merocyanine dye, (including a zero-methine merocyanine dye (simple merocyanine dye), a 3-nucleus merocyanine dye, a 4-nucleus merocyanine dye, a rhodacyanine dye, a complex cyanine dye, a complex merocyanine dye, an allopolar dye, an oxonol dye, a hemioxonol dye, a squarium dye, a croconium dye, an azamethine dye, a coumarin dye, an arylidene dye, an anthraquinone dye, a triphenylmethane dye, an azo dye, an azomethine dye, a spiro dye, a metallocene dye, a fluorenone dye, a flugido dye, a perylene dye, a perinone dye, a phenazine dye, a phenothiazine dye, a quinone dye, diphenylmethane dye, a polyene dye, an acridine dye, an acridinone dye, a diphenylamine dye, a quinacridone dye, a quinophtharone dye, a phenoxazine dye, a phthaloperylene dye, a diketopyrrolopyrrole dye, a dioxane dye, a porphyrin dye, a chlorophyll dye, phthalocyanine dye, metal complex dyes, and condensed aromatic carbocyclic dyes (naphthalene derivatives, anthracene derivatives, phenanthrene derivatives, tetracene derivatives, pyrene derivatives, perylene derivatives, and fluoranthene derivatives).

It is particularly preferable to use, as an n-type organic semiconductor, fullerene or a fullerene derivative which is superior in electron transportability. Fullerene includes fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$ mixed fullerene, and fullerene nanotube. Usable fullerene derivatives are compounds that are the above various types of fullerene having a substituent group.

Preferable as the substitution group of a fullerene derivative is an alkyl group, an aryl group or a heterocyclic group. More preferable as the alkyl group is an alkyl group whose carbon number is any of 1 through 12, preferable as the aryl group or the heterocyclic group is a benzene cycle, a naphthalene cycle, an anthracene cycle, a phenanthrene cycle, a fluorene cycle, a triphenylene cycle, a naphthacene cycle, a biphenyl cycle, a pyrrole cycle, a furan cycle, a thiophene cycle, an imidazole cycle, an oxazole cycle, a thiazole cycle, a pyridine cycle, a pyrazine cycle, a pyrimidine cycle, a pyridazine cycle, an indolizine cycle, an indole cycle, a benzofurane cycle, a benzothiophene cycle, an isobenzofurane cycle, a benzimidazole cycle, an imidazopyridine cycle, a quinolidine cycle, a quinoline cycle, a phthalazine cycle, a naphthyridine cycle, a quinoxaline cycle, a quinoxazoline cycle, an isoquinoline cycle, a carbazole cycle, a phenanthridine cycle, an acridine cycle, a phenanthroline cycle, a thianthrene cycle, a chromen cycle, a xanthene cycle, a phenoxathiine cycle, a phenothiazine cycle or a phenazine cycle, more preferable is a benzene cycle, a naphthalene cycle, an anthracene cycle, a phenanthrane cycle, a pyridine cycle, an imidazole cycle, an oxazol cycle or a thiazole cycle, and especially preferable is the benzene cycle, the naphthalene cycle or the pyridine cycle. Each of these cycles may well further have a substitution group, and the substitution group may well form a cycle by bonding as far as possible. Incidentally, each of the above cycles may well have a plurality of substitution groups, and they may be either the same or different. Besides, the plurality of substitution groups may well form a cycle or cycles by bonding as far as possible.

Since the photoelectric conversion layer contains the fullerene or the fullerene derivative, charges generated by photoelectric conversion can be fast transported to the pixel electrode 104 or the opposite electrode 108 via fullerene molecules or fullerene derivative molecules. When the path of the charges is formed in a state where the fullerene molecules or the fullerene derivative molecules are joined, a charge transportability is enhanced, and the quick response of the photoelectric converter becomes realizable. For this purpose, the fullerene or the fullerene derivative should preferably be contained at least 40% in the photoelectric conversion layer. However, when the content of the fullerene or the fullerene derivative is too large, the content of a p-type organic semiconductor becomes small, and the area of a junction interface becomes small, so that an excitor dissociation efficiency lowers.

When a triarylamine compound stated in Japanese Patent No. 4,213,832 etc. is employed as the p-type organic semiconductor which is mixed with the fullerene or the fullerene derivative in the photoelectric conversion layer, the high S/N ratio of the photoelectric converter becomes realizable, and this is especially preferable. When the proportion of the fullerene or the fullerene derivative within the photoelectric conversion layer is too large, the quantity of the triarylamine compound becomes small, and the absorption quantity of input light decreases. Thus, the photoelectric conversion efficiency lowers, so that the fullerene or the fullerene derivative which is contained in the photoelectric conversion layer should preferably have a composition of at most 85%.

Next, the configuration of the readout circuit 116 will be described.

Figure 3:
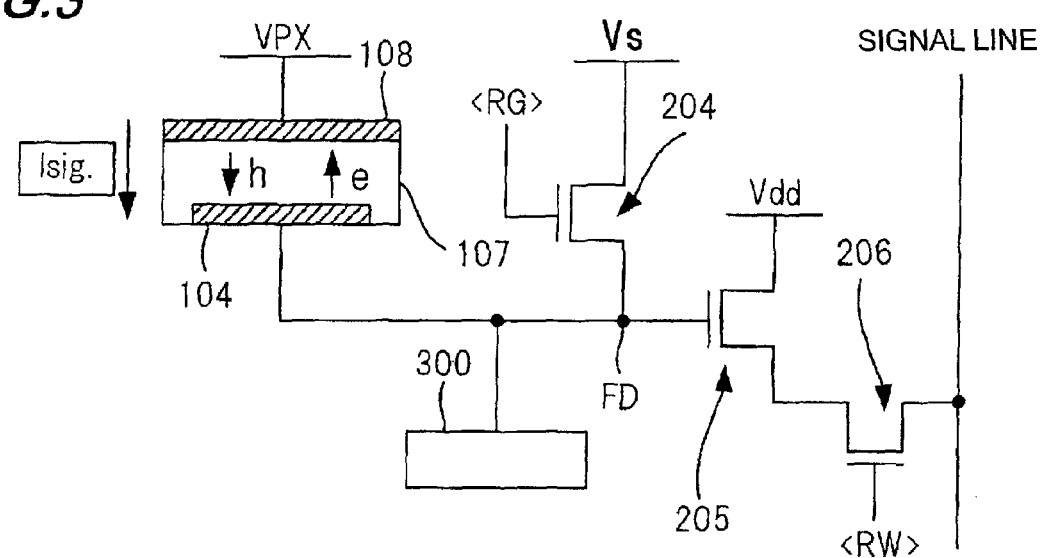
FIG. 3 is a diagram showing the configuration of a readout circuit in the solid-state imaging device shown in FIG. 1.

FIG. 3 is a diagram showing the configuration of the readout circuit 116 in the solid-state imaging device 100 shown in FIG. 1.

The readout circuit 116 may be a well-known MOS transistor circuit having 3-transistor configuration or 4-transistor configuration which includes a transistor for protecting the readout circuit. For example, in the example of FIG. 3, this readout circuit includes a floating diffusion FD being a charge accumulation portion, a reset transistor 204, an output transistor 205, a selection transistor 206, and a protective circuit 300 for preventing an excessive rising in potential of the floating diffusion FD. Each of the reset transistor 204, the output transistor 205 and the selection transistor 206 is configured of an n-channel MOS transistor (nMOS transistor).

The floating diffusion FD is electrically connected with the pixel electrode 104, and its potential changes in accordance with the potential of the pixel electrode 104. In the example of FIG. 3, a voltage VPX to be applied to the opposite electrode 108 is set so that, within the photoelectric conversion layer 107, a signal current Isig may flow from the opposite electrode 108 toward the pixel electrode 104 (in other words, holes may be collected by the pixel electrode 104) during an exposure period. During the exposure period, therefore, the signal current Isig flows to the pixel electrode 104, whereby the potential of the pixel electrode 104 rises, and consequently, also the potential of the floating diffusion FD rises.

The reset transistor 204 serves to reset the potential of the floating diffusion FD to a reset potential. The reset transistor 204 has its drain terminal electrically connected to the floating diffusion FD, and a reset power source, not shown, is connected to the source terminal of the reset transistor 204, so as to supply a voltage Vs therefrom. When a reset pulse RG which is impressed on the gate terminal of the reset transistor 204 becomes a high level, the reset transistor 204 is turned ON, and electrons are injected from the source of the reset transistor 204 into the drain thereof. Owing to the electrons, the potential of the floating diffusion FD drops to the reset potential.

The output transistor 205 converts the potential of the floating diffusion FD into a voltage signal and then outputs the voltage signal. This output transistor 205 has its gate terminal electrically connected to the floating diffusion FD, and the power source of the solid-state imaging device 100 is connected to the drain terminal of the output transistor 205, so as to supply a power source voltage Vdd which is a maximum value of a voltage to be supplied to the readout circuit 116 from this power source. Besides, the source terminal of the output transistor 205 is connected to the drain terminal of the selection transistor 206.

The selection transistor 206 serves to selectively output the output signal of the output transistor 205 to a signal line. This selection transistor 206 has its source terminal connected to the signal line. When a selection pulse RW which is impressed on the gate terminal of the selection transistor 206 becomes a high level, this selection transistor 206 turns ON, and the voltage signal converted by the output transistor 205 is outputted to the signal line.

The protective circuit 300 is connected to the floating diffusion FD. The protective circuit 300 may includes a diode or a transistor which prevent the potential of the floating diffusion FD from rising over the power source voltage Vdd Owing to such a circuit configuration, the readout circuit 116 can read out, on the signal line, the signal which corresponds to the charges (or holes) collected by the pixel electrode 104.

Next, the operations of the readout circuit 116 will be described with reference to the individual potentials of the floating diffusion FD connected to the drain region of the reset transistor 204, the source region RS of the reset transistor 204, and that region RC of the reset transistor 204 which is the region of the substrate 101 underlying the gate electrode of the reset transistor 204.

FIGS. 4A through 4D are potential diagrams for explaining the operations of the readout circuit 116 in the solid-state imaging device 100 shown in FIG. 1. The potentials illustrated in FIGS. 4A through 4D have values taken with reference to a reference potential GND (for example, a ground potential).

Figure 4A:
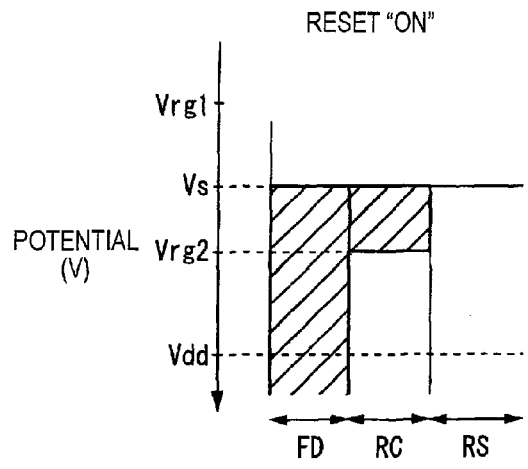
FIGS. 4A through 4D are potential diagrams for explaining the operation of the readout circuit in the solid-state imaging device shown in FIG. 1.

FIG. 4A is the diagram showing the sectional potentials of the floating diffusion FD, the channel region RC and the source region RS at the time when the reset transistor 204 has been brought into its ON state.

Figure 4B:
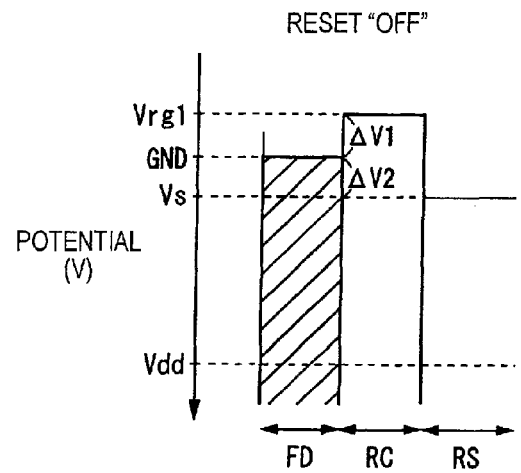

FIG. 4B is the diagram showing the sectional potentials of the floating diffusion FD, the channel region RC and the source region RS immediately after the reset transistor 204 has been turned from its ON state into its OFF state.

Figure 4C:
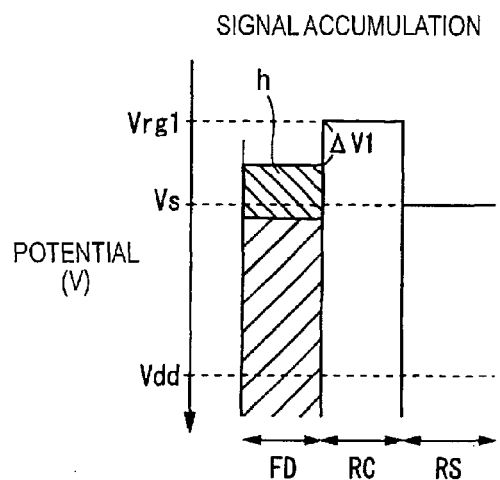

FIG. 4C is the diagram showing the sectional potentials of the floating diffusion FD, the channel region RC and the source region RS at the time when the charges generated in the photoelectric conversion layer of the organic layer 107 after the reset transistor 204 has been brought into its OFF state are accumulated in the floating diffusion FD.

Figure 4D:
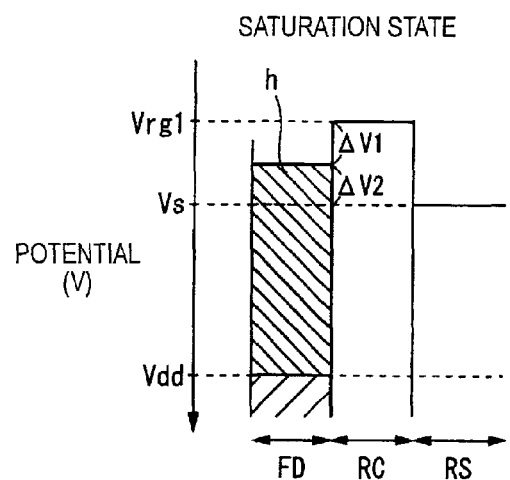

FIG. 4D is the diagram showing the sectional potentials of the floating diffusion FD, the channel region RC and the source region RS at the time when the accumulation of the charges into the floating diffusion FD has proceeded from the state of FIG. 4C, till a saturation state where potential of floating diffusion FD reaches Vdd. In each of the diagrams, a part indicated by oblique hatching represents a region in which the electrons are collected.

First, before the start of the exposure, the reset pulse is fed to the gate electrode of the reset transistor 204 by the vertical driver 121, whereby this reset transistor 204 turns into its ON state.

As shown in FIG. 4A, when the reset transistor 204 turns into its ON state, the potential of the channel region RC becomes a potential Vrg2 higher than the potential Vs of the source region RS. As a result, the potential of the floating diffusion FD becomes the same as the potential Vs of the source region RS, and the floating diffusion FD is reset to the reset potential Vs.

Subsequently, when the feed of the reset pulse is stopped, the reset transistor 204 turns into its OFF state. The potentials immediately after the reset transistor 204 has turned into its OFF state, become as shown in FIG. 4B.

As shown in FIG. 4B, the potential of the channel region RC drops from the potential Vrg2 to a potential Vrg1, and the potential of the floating diffusion FD becomes ΔV2 lower than the reset potential Vs on the basis of the parasitic capacitance between the floating diffusion FD and the gate of reset transistor.

When the accumulation period is started with the stop of the feed of the reset pulse, the holes among the charges generated in the photoelectric conversion layer are accumulated in the floating diffusion FD. Since a large number of electrons exist in the floating diffusion FD, the accumulated holes are immediately combined with the electrons and annihilated. Thus, the potential of the floating diffusion FD changes. As shown in FIG. 4C, as the accumulated holes increase more, the potential of the floating diffusion FD becomes higher.

Besides, as shown in FIG. 4D, the saturation state is reached at the time when the potential of the floating diffusion FD has arrived at the vicinity of the power source voltage Vdd supplied to the output transistor 205. Incidentally, the reason why the saturation state is set here at the time when the potential of the floating diffusion FD has arrived at the vicinity of the power source voltage Vdd of the output transistor 205, is as follows: When the potential of the floating diffusion FD exceeds the power source voltage Vdd, an excessive voltage is applied to the floating diffusion FD, and hence, this floating diffusion FD is apprehended to break down.

The dynamic range of the signal voltage of the solid-state imaging device 100 is determined by the amplitude of the voltage of the floating diffusion FD which varies based on the accumulation of the holes h as shown in FIG. 4D. That is, as a difference in potential of the floating diffusion FD between a state where the hole h is not accumulated as shown in FIG. 4B and a state where the hole h is accumulated and the potential of the floating diffusion FD reaches Vdd as shown in FIG. 4D, the amplitude of the voltage becomes larger and the dynamic range becomes wider. The potential of the floating diffusion FD in the saturation state in FIG. 4D is the power source voltage Vdd. For example, Vdd is 3.3 V. Thus, as the potential of the floating diffusion FD in the state shown in FIG. 4B gets close to the reference potential GND (for example, 0 V), the dynamic range becomes wider.

The potential Vfd(Reset) of the floating diffusion FD immediately after the reset transistor 204 has been brought into its OFF state, is determined by the following formula (1):

$$Vfd(\text{Reset}) = Vs - \Delta V2 \quad (1)$$

As discussed previously, in the solid-state imaging device 100, the maximum dynamic range is realized when Vfd(Reset) of Formula (1) matches the reference potential GND. That is, for the purpose of realizing the maximum dynamic range, the reset potential Vs is determined so as to satisfy the following formula (2) deduced by substituting the reference potential GND into the potential Vfd(Reset) of Formula (1):

$$Vs = GND + \Delta V2 \quad (2)$$

However, in the solid-state imaging device 100, in fact, the voltages to be supplied to the pixels are different among pixels. The voltage Vs is required to be determined so that Vfd(Resed) in the all pixels becomes as close to the reference potential GND as possible. As mentioned above, in order to enlarge the dynamic range, it is preferable to set Vfd(Reset) small so that Vfd(Reset) is close to GND. However, if Vfd(Resed) becomes lower than the reference potential GND, a leakage of the charges into the substrate 101 occurs and degrades the image quality considerably. Accordingly, the voltage Vs is required to be set so that Vfd(Reset) in the all pixels becomes close to the reference potential GND and never becomes smaller than the reference potential GND.

With a keen examination by the inventor, in the solid-state imaging device 100, it is found that the difference of voltage to be supplied to the pixels is at most about ±10% of the power source voltage Vdd. Therefore, the voltage difference between the highest voltage and the lowest voltage to be supplied to the pixels may be at most about 20% of the power source voltage Vdd. By taking that the voltage Vfd(Reset) should be set not to become lower than the reference potential GND with the voltage difference into consideration, the formula (2) may be modified as following formula (2'):

$$GND < Vs < GND + \Delta V2 + (Vdd/5) \quad (2')$$

The widest dynamic range may be realized when the formula (2') is satisfied.

On the other hand, when the potential of the floating diffusion after reset OFF is set to be low as show in FIG. 4, a leakage between the floating diffusion and the source region RS of the reset transistor 204 tends to occur. So, a devisal is required so that, in the state of FIG. 4B, the holes which come to be accumulated into the floating diffusion FD may not leak out into the source region RS beyond the potential of the channel region RC. With a keen examination by the inventor, in order to prevent the leaking out of the charges, it is found that the relationship between the potential Vrg1 of the channel region RC and the potential Vfd(Reset) is important. Concretely, when ΔV1 is let denote a critical potential at which the leak-out of the charges from the floating diffusion FD into the power source (the source region RS) of the reset transistor 204 does not occur in the OFF state of this reset transistor 204, it is important to determine the potential Vrg1 and the potential Vfd(Reset) so as to satisfy the following formula (3):

$$Vfd(\text{Reset}) > (Vrg1 + \Delta V1) \quad (3)$$

Incidentally, the potential Vrg1 can be expressed by the following formula (4), using the threshold voltage Vth_rs and modulation degree m of the reset transistor 204, and the voltage (set at the voltage GND in this embodiment) applied to the gate electrode of the reset transistor 204 at the time when this transistor is in its OFF state:

$$Vrg1 = (GND - Vth\_rs) \times m \quad (4)$$

In order to prevent the image lag, a complete reset by which the potential of the floating diffusion FD and the potential of the source region RS of the reset transistor becomes the same potential in a state of FIG. 4A is required. For the complete reset, the relationship between the potential Vrg2 of the channel region RC and the potential Vs of the source region RS is important. Concretely, the potential Vrg2 and the potential Vs are determined so as to satisfy the following formula (5):

$$Vrg2 > Vs \quad (5)$$

Incidentally, the potential Vrg2 can be expressed by the following formula (6), using the threshold voltage Vth_rs and modulation degree m of the reset transistor 204, and the voltage (set at the voltage Vdd in this embodiment) applied to the gate electrode of the reset transistor 204 when this transistor is in its ON state:

$$Vrg2 = (Vdd - Vth\_rs) \times m \quad (6)$$

Based on the formulas (3) to (6), a range that the threshold voltage Vth_rs of the reset transistor 204 is determined as follow.

When Formula (5) is reduced using Formula (6), the following formula (7) is obtained:

$$\{Vdd - (Vs/m)\} > Vth\_rs \quad (7)$$

Besides, when Formula (3) is reduced using Formula (1) and Formula (4), the following formula (8) is obtained:

$$Vth\_rs > \{GND + (\Delta V1 + \Delta V2 - Vs)/m\} \quad (8)$$

When the term Vs is eliminated by substituting Formula (2) into Formula (7) and Formula (8), the following formula (9) is obtained:

$$\{GND + (\Delta V1 - GND)/m\} < Vth\_rs < \{Vdd - (\Delta V2 + GND)/m\} \quad (9)$$

In this manner, the threshold voltage Vth_rs satisfies the relationship of Formula (9) in the solid-state imaging device 100. Owing to the satisfaction of the relationship of Formula (9), the complete reset based on the reset transistor 204 is realized while the widest dynamic range is realized. Further, the leakage ascribable to the leak-out of the charges from the floating diffusion FD into the source region RS can be prevented from occurring in a period from a state immediately after the reset in which the amount of the accumulated charges is small to the saturation state.

Values used in a general MOS-type image sensor (GND=0 V, Vdd=3.3 V, and m=0.9) are substituted into Formula (9). Further, $\Delta V1 = \Delta V2 = 0.5$ V is assumed. Then, $0.55 < Vth\_rs < 2.75$ is obtained. In this range, the solid-state imaging device 100 can be operated with no problem without causing the leakage ascribable to the charge leak-out, while the widest dynamic range is realized.

Next, for the sake of comparison, there will be described the operation of a general configuration wherein electrons are collected by the pixel electrode 104 in the solid-state imaging device 100, and wherein a signal corresponding to the quantity of the electrons is read out by the readout circuit 116. In this configuration, for the purpose of enlarging a dynamic range to the utmost, the potential Vs of the source region RS of the reset transistor 204 (in case of this configuration, the source region becomes a drain region, but the name is held unchanged) is generally set at the power source voltage Vdd, and Vs=Vdd shall be assumed in the ensuing description.

When the electrons are collected by the pixel electrode 104, the voltages to be supplied to the pixels are different among pixels similarly to the case that the holes are collected by the pixel electrode. For easy comparison, the difference of the supply voltage among pixels is set to be zero in the ensuing description.

FIGS. 5A through 5D are potential diagrams for explaining the operation of the readout circuit 116 in the case of the configuration in which the electrons are collected by the pixel electrode 104 in the solid-state imaging device 100 shown in FIG. 1.

Figure 5A:
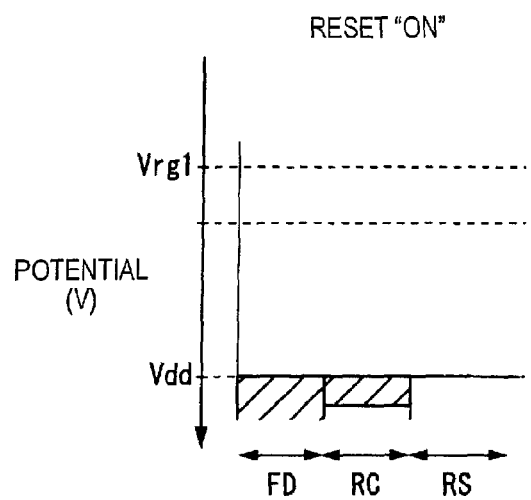
FIGS. 5A through 5D are potential diagrams for explaining the operation of the readout circuit at the time when the solid-state imaging device shown in FIG. 1 is configured so as to collect electrons by pixel electrodes.

FIG. 5A is the diagram showing the sectional potentials of the floating diffusion FD, the channel region RC and the source region RS at the time when the reset transistor 204 has been brought into its ON state.

Figure 5B:
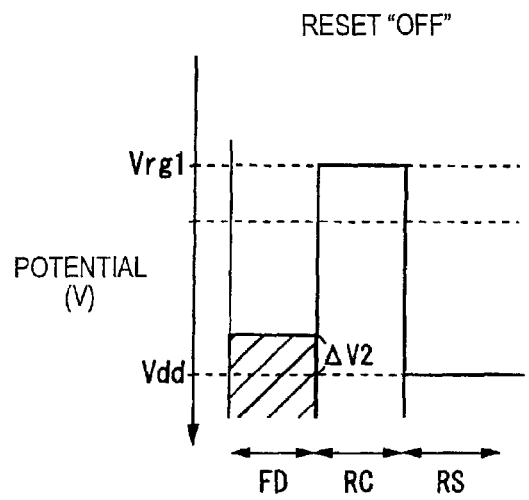

FIG. 5B is the diagram showing the sectional potentials of the floating diffusion FD, the channel region RC and the source region RS immediately after the reset transistor 204 has been turned from its ON state into its OFF state.

Figure 5C:
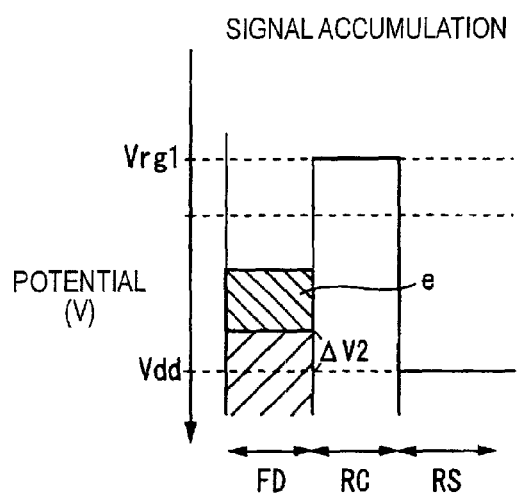

FIG. 5C is the diagram showing the sectional potentials of the floating diffusion FD, the channel region RC and the source region RS at the time when the electrons generated in the photoelectric conversion layer of the organic layer 107 after the reset transistor 204 has been brought into its OFF state are accumulated in the floating diffusion FD.

Figure 5D:
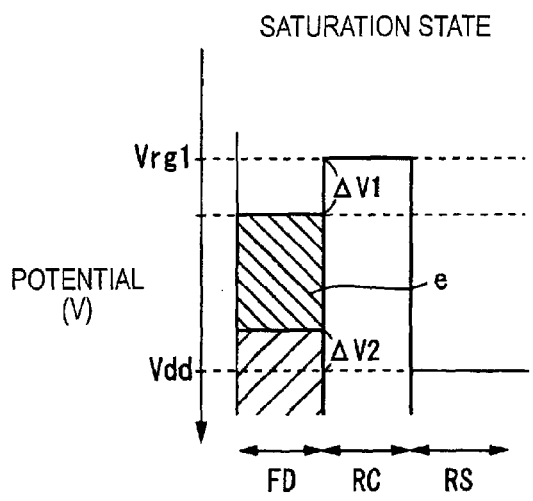

FIG. 5D is the diagram showing the sectional potentials of the floating diffusion FD, the channel region RC and the source region RS at the time when the accumulation of the electrons into the floating diffusion FD has proceeded from the state of FIG. 5C, till a saturation state where any electrons cannot be accumulated more.

First, before the start of the exposure, the reset pulse is fed to the gate electrode of the reset transistor 204 by the vertical driver 121, whereby this reset transistor 204 turns into its ON state.

As shown in FIG. 5A, when the reset transistor 204 turns into its ON state, the potential of the channel region RC becomes a potential higher than the potential Vdd of the source region RS. As a result, the potential of the floating diffusion FD becomes the same as the potential Vdd of the source region RS, and the floating diffusion FD is reset to the reset potential Vdd.

Subsequently, when the feed of the reset pulse is stopped, the reset transistor 204 turns into its OFF state. The potentials immediately after the reset transistor 204 has turned into its OFF state, become as shown in FIG. 5B.

As shown in FIG. 5B, the potential of the channel region RC drops to a potential Vrg1, and the potential of the floating diffusion FD becomes $\Delta V2$ lower than the reset potential Vdd on the basis of the parasitic capacitance between the floating diffusion FD and the gate of reset transistor.

When the accumulation period is started with the stop of the feed of the reset pulse, the electrons among the charges generated in the photoelectric conversion layer are accumulated in the floating diffusion FD. When the electrons are accumulated in the floating diffusion FD, the potential of the floating diffusion FD becomes lower as the electrons accumulated therein increase more, as shown in FIG. 5C.

Besides, as shown in FIG. 5D, the saturation state is reached at the time when the potential of the floating diffusion FD has arrived at a potential obtained by adding $\Delta V1$ to the potential Vrg1. Even when electrons are accumulated after the establishment of the saturation state, the accumulated electrons leak out into the source region RS, and hence, a signal magnitude does not change. When the potential of the floating diffusion FD is lower than the reference potential GND, the signal charges leak out into the substrate, and hence, a minimum potential of the floating diffusion FD must be higher than the reference potential GND in the saturation state.

The dynamic range in the case of the configuration in which the electrons are collected by the pixel electrode 104, is determined by the width of the potential difference between the potential of the floating diffusion FD in FIG. 5B and the potential of the floating diffusion FD in FIG. 5D. That is, as the potential of the floating diffusion FD in the state shown in FIG. 5B gets higher, the dynamic range becomes wider. If the potential of the floating diffusion FD in the state shown in FIG. 5B becomes the potential Vdd, the widest dynamic range can be realized.

The potential Vs of the source region RS needs to be set at (Vdd+ΔV2) which is higher than the potential Vdd in order that the potential of the floating diffusion FD immediately after the reset transistor 204 has been brought into its OFF state, may be made the potential Vdd. In order to realize this condition, however, the source region RS is required to withstand to be applied the potential Vdd or above. Therefore, a special well needs to be provided in the source region RS of each of all the pixels. Since providing the special well in every pixel causes an enlargement of a pixel size and an increase of the number of manufacturing procedures, that decreases the number of pixels and increases cost.

In contrast, in accordance with the foregoing configuration in which the holes are collected by the pixel electrode 104, the potential Vs is determined so as to satisfy Formula (2), for the purpose of realizing the maximum dynamic range. The potential difference ΔV2 does not become larger than the potential Vdd though this differs depending also upon a design. Therefore, the source region RS may be a standard impurity region and may be formed by a standard manufacturing process. Therefore, the reduction of the pixel size and the reduction of the manufacturing cost is possible. Accordingly, in accordance with the solid-state imaging device 100, the widest dynamic range can be realized while increase in the number of pixels and decrease in the cost as are based on the pixel size reduction are realized.

Next, there will be described examples of arrangements of the protective circuit 300 which prevent the potential of the floating diffusion FD from exceeding the potential Vdd.

Figure 6:
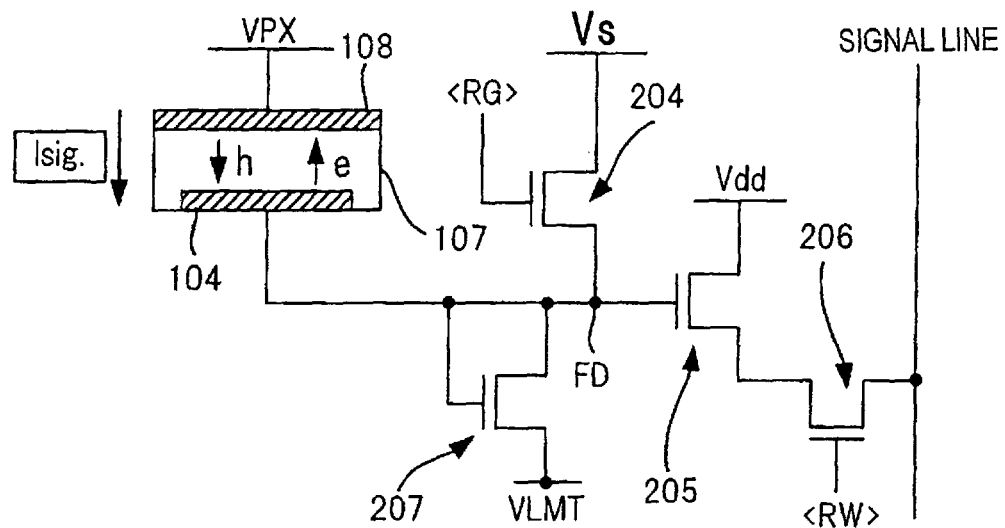
FIG. 6 is a diagram showing a configuration in which a transistor being protective means is added to the circuit shown in FIG. 3.

FIG. 6 shows one of arrangements of the protective circuit 300 shown in FIG. 3. The protective circuit 300 shown in FIG. 6 is composed of the transistor 207 of nMOS type. The transistor 207 has its gate terminal and its drain terminal electrically connected with the pixel electrode 104 and the floating diffusion 1-D, and has its source terminal fed with a voltage VLMT.

Owing to the transistor 207, the potential of the floating diffusion FD can be prevented from rising to a value obtained by adding the threshold voltage Vth of the transistor 207 to the voltage VLMT (that is, a value of VLMT+Vth), or above. The value (VLMT+Vth) is set at the vicinity of the potential Vdd, whereby the potential of the floating diffusion FD can be prevented from becoming the potential Vdd or above.

Figure 7:
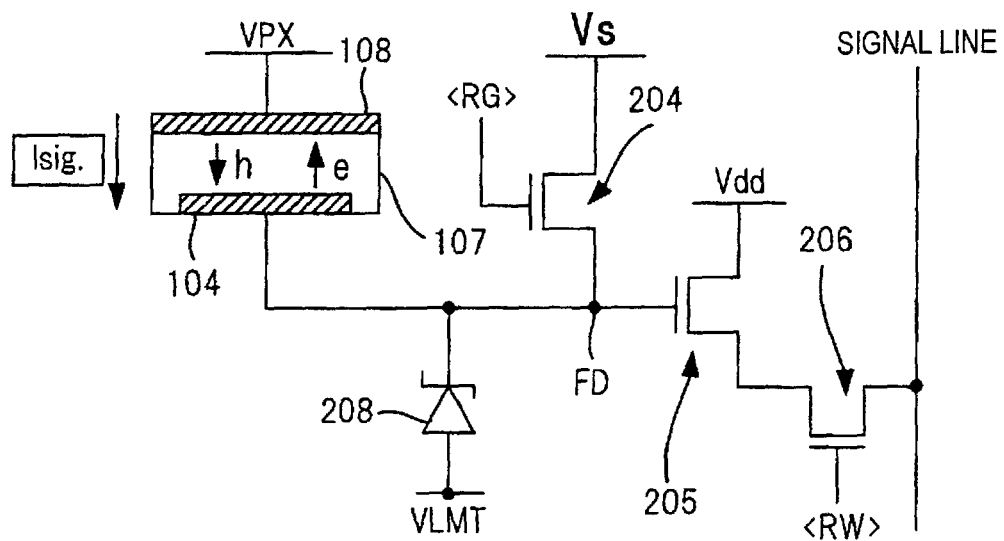
FIG. 7 is a diagram showing a configuration in which a diode being protective means is added to the circuit shown in FIG. 3.

FIG. 7 shows the other arrangements of the protective circuit shown in FIG. 3. The protective circuit shown in FIG. 7 is composed of the diode 208. The diode 208 has its cathode electrically connected with the pixel electrode 104 and the floating diffusion FD, and has its anode fed with the voltage VLMT.

Owing to the diode 208, the potential of the floating diffusion FD can be prevented from rising to a value obtained by adding the breakdown voltage Vb of the diode 208 to the voltage VLMT (that is, a value of VLMT+Vb), or above. The value (VLMT+Vb) is set at the vicinity of the potential Vdd, whereby the potential of the floating diffusion FD can be prevented from becoming the potential Vdd or above.

In view of the purpose for enlarging the dynamic range, the protective circuit 300 shown in FIG. 3 may be omitted. When the protective circuit 300 is omitted, in the accumulation period, the potential of the floating diffusion FD may rise over the potential Vdd. However, in this case, in an operation region where the potential of the floating diffusion FD is higher than the potential of Vdd, it is impossible to read out the signal outside since the operation region is outside of an active region of the post-circuit connected to the floating diffusion FD. So, if the protective circuit 300 is omitted, a saturation potential of the floating diffusion FD may be regarded as the potential Vdd similarly to the case where the protective circuit 300 is provided.

Thus far, the width of the voltage magnitude of the floating diffusion FD is explained. In order to realize the widest dynamic range, a voltage range in which the output transistor 205 properly operates is required to be set so that the potential of the floating diffusion is able to be output to the signal line. The range of the potential of the floating diffusion FD in which the output transistor 205 can output a signal corresponding to the potential of the floating diffusion FD is shown as follow:

$$Vth\_SF < (\text{potential of floating diffusion FD}) < (Vdd + Vth\_SF)$$

Vth_SF denotes the threshold voltage of the output transistor 205. According to this, to output the potential of the floating diffusion in the state of FIG. 4B as a signal, the threshold voltage Vth_SF of this output transistor 205 should preferably satisfy the relationship of the following formula (10):

$$(Vrg1 + \Delta V1 - Vdd) < Vth\_SF < (Vrg1 + \Delta V1) \qquad (10)$$

By satisfying the formula (10), when the signal charges are not accumulated in the floating diffusion FD, the output transistor outputs a proper signal indicating black level to the signal line. Incidentally, the threshold voltage Vth_SF should desirably be as large as possible, within the range of Formula (10) to enlarge the dynamic range.

Figure 8:
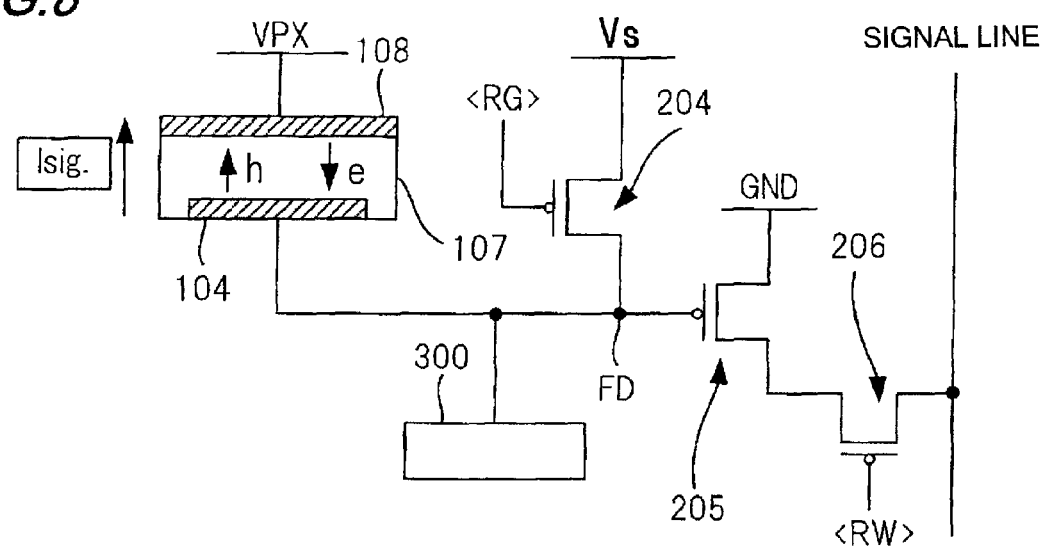
FIG. 8 is a diagram showing a variation of pixels of the solid-state imaging device shown in FIG. 1.

With respect to the circuit shown in FIG. 3, all transistor may be regarded as p-channel MOS transistor, and the electrons may be corrected by the pixel electrode 104 so that the readout circuit 116 composed of p-channel MOS transistor readouts a signal corresponding to the corrected electrons. FIG. 8 shows this configuration.

FIG. 8 is a diagram showing a variation of the readout circuit shown in FIG. 3. The configuration of the readout circuit shown in FIG. 8 is common to the readout circuit shown in FIG. 3 except the reset transistor 204, the output transistor 205, and the selection transistor 206, which are replaced with p-channel MOS transistors, the protective circuit 300 which are changed so that the potential of the floating diffusion FD does not become lower than the potential of the reference potential GND, n-well (not shown) in which the readout circuit is formed and which is biased with the power source voltage. In FIG. 3, the semiconductor region of the readout circuit is formed in p-well. The semiconductor region includes the floating diffusion FD and the semiconductor region of each of the transistors and the protective circuit.

In FIG. 8, a voltage value lower than the reference potential GND, for example, −10V, is applied to the opposite electrode 108. The reference potential GND is applied to the drain of the output transistor 205. FIG. 9 shows the potential of each portions of the readout circuit in a state where the reset transistor is "ON" state, a state where the reset transistor is "OFF" immediately after switching from "ON" state, a signal charge accumulation state, and a saturation state in which the charges are not accumulated any more.

FIG. 9A to 9D is common to FIG. 4 except the axis of each graphs and the position of the potential of GND and the potential of Vdd. In FIG. 9A to 9D, as the position gets higher on the graph, the potential becomes higher.

Hereinafter, explanation of FIGS. 9A to 9D will be described.

Figure 9A:
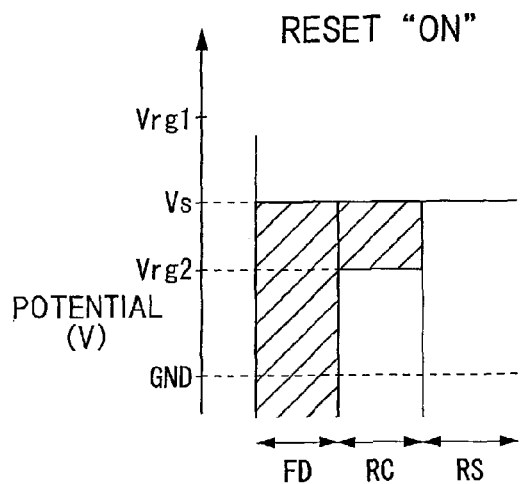
FIGS. 9A through 9D are potential diagrams for explaining the operation of the readout circuit in the solid-state imaging device shown in FIG. 8.

As shown in FIG. 9A, when the reset transistor 204 turns into its ON state, the potential of the channel region RC becomes the potential Vgr2 which is lower than the potential of the source region RS. As a result, the potential of the floating diffusion FD becomes the potential Vs which is the same as the source region RS and the floating diffusion FD is reset to the reset potential Vs.

Next, when the feed of the reset pulse is stopped, the reset transistor 204 turns into its OFF state. The potential immediately after the reset transistor 204 has turned into its OFF state, become as shown FIG. 9B.

Figure 9B:
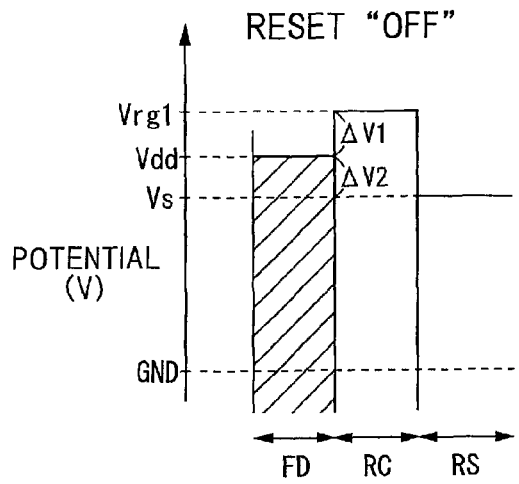

As shown in FIG. 9B, the potential of the channel region RC rises from the potential Vrg2 to a potential Vrg1, and the potential of the floating diffusion FD becomes $\Delta V2$ higher than the reset potential Vs on the basis of the parasitic capacitance between the floating diffusion FD and the gate of reset transistor 204. In FIG. 9B, $\Delta V1$ is voltage difference between the potential of the floating diffusion FD and the potential of the channel region RC. The $\Delta V1$ is set to be a minimum value so that the accumulated electron in the floating diffusion does not leak out into the source region of the reset transistor 204.

Figure 9C:
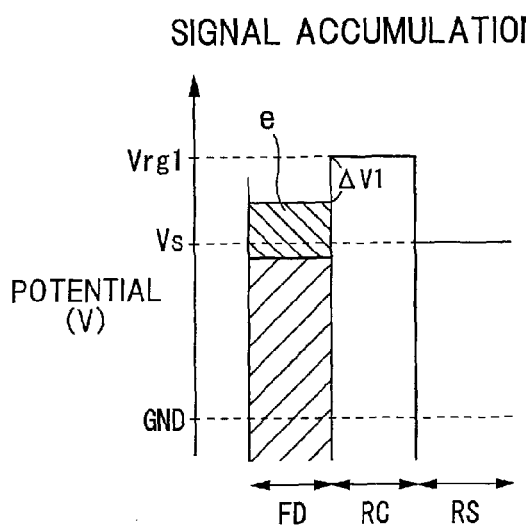

When the accumulation period is started with the stop of the feed of the reset pulse, the electrons among the charges generated in the photoelectric conversion layer are accumulated in the floating diffusion FD. When the electrons are accumulated in the floating diffusion FD, the potential of the floating diffusion FD becomes lower as the electrons accumulated therein increase more, as shown in FIG. 9C.

Figure 9D:
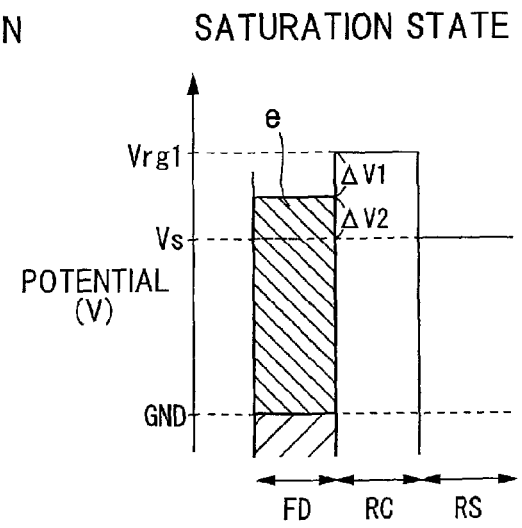

Besides, as shown in FIG. 9D, the saturation state is reached at the time when the potential of the floating diffusion FD has arrived at a potential about the reference potential GND. As stated above, the readout circuit includes the protective circuit 300 so that the potential of the floating diffusion FD does not become lower than the reference potential GND.

In this configuration, the formulas (1), (2), (2'), (3) to (10) may be transformed as follow:

$$Vfd(Reset) = Vs + \Delta V2 \quad (1a)$$

$$Vs = Vdd - \Delta V2 \quad (2a)$$

$$Vdd - \Delta V2 - (Vdd/5) < Vs < Vdd \quad (2a')$$

$$Vfd(Reset) < (Vrg1 - \Delta V1) \quad (3a)$$

$$Vrg1 = (Vdd - Vth\_rs) \times m \quad (4a)$$

$$Vrg2 < Vs \quad (5a)$$

$$Vrg2 = (GND - Vth\_rs) \times m \quad (6a)$$

$$\{GND - (Vs/m)\} < Vth\_rs \quad (7a)$$

$$Vth\_rs < \{Vdd - (\Delta V1 + \Delta V2 + Vs)/m\} \quad (8a)$$

$$\{GND - (Vdd - \Delta V2)/m\} < Vth\_rs < \{Vdd - (Vdd + \Delta V1)/m\} \quad (9a)$$

$$(Vrg1 - \Delta V1 - Vdd \times 2) < Vth\_SF < (Vrg1 - \Delta V1 - Vdd) \quad (10a)$$

As shown above, even if the configuration of FIG. 8 is introduced, when the relations in the formulas (2a') is satisfied, the widest dynamic range can be realized with increase in the number of pixels by the reduction of the pixel size and decrease in the cost.

In the readout circuit shown in FIG. 8, the protective circuit also may be omitted. When the readout circuit is omitted, the potential of the signal to be readout by the output transistor should be controlled so that the output transistor does not readout the signal which potential is lower than the reference potential GND.

As described above, items to be stated below are disclosed in this specification.

A disclosed solid-state imaging device is a solid-state imaging device comprising a photoelectric conversion layer which is formed over a semiconductor substrate, and a MOS transistor circuit which reads out a signal corresponding to charges generated in the photoelectric conversion layer and then collected, and which is formed in the semiconductor substrate, wherein the MOS transistor circuit includes a charge accumulation portion which is electrically connected with the photoelectric conversion layer, a reset transistor which resets a potential of the charge accumulation portion to a reset potential, and an output transistor which outputs a signal corresponding to the potential of the charge accumulation portion; the reset transistor and the output transistor have carriers whose polarity is opposite to a polarity of the charges generated in the photoelectric conversion layer and then collected; and letting "GND" denote a reference potential of all potentials, "Vs" denote the reset potential, and "$\Delta V2$" denote a difference between a first potential of the charge accumulation portion in a case where the reset transistor is in its ON state and a second potential of the charge accumulation portion immediately after the reset transistor has turned from its ON state into its OFF state, a relationship of $GND < Vs < GND + \Delta V2 + (Vdd/5)$ ... (11) holds.

The disclosed solid-state imaging device is a solid-state imaging device wherein letting "Vrg1" denote a potential of a region of the semiconductor substrate underlying a gate electrode of the reset transistor in a case where the reset transistor is in its OFF state, "$\Delta V1$" denote a critical potential at which leak-out of the charges from the charge accumulation portion into a reset power source of the reset transistor does not occur in the OFF state of the reset transistor, and "Vfd" denote the second potential, a relationship of $Vfd > (Vrg1 + \Delta V1)$ ... (12) holds.

The disclosed solid-state imaging device is a solid-state imaging device wherein letting "Vrg2" denote a potential of the region of the semiconductor substrate underlying the gate electrode of the reset transistor in a case where the reset transistor is in its ON state, a relationship of $Vrg2 > Vs$ ... (13) holds, and a threshold voltage of the reset transistor lies within a range which satisfies the relationships of (11), (12) and (13).

The disclosed solid-state imaging device is a solid-state imaging device wherein letting "Vdd" denote a power source voltage of the output transistor, and "Vth" denote a threshold voltage of the output transistor, a relationship of $(Vrg1 + \Delta V1 - Vdd) < Vth < (Vrg1 + \Delta V1)$ holds.

A disclosed imaging apparatus is an imaging apparatus which comprises a solid-state imaging device as defined above.

As described with reference to the embodiment, it is possible to provide a solid-state imaging device and an imaging apparatus which can realize a high sensitivity and a wide dynamic range.

DESCRIPTION OF REFERENCE NUMERALS

101 Substrate
116 Readout circuit
204 Reset transistor
205 Output transistor

What is claimed is:

1. A solid-state imaging device comprising:
a photoelectric conversion layer that is formed over a semiconductor substrate; and
a MOS transistor circuit that reads out a signal corresponding to charges generated in the photoelectric conversion layer and then collected, and that is formed in the semiconductor substrate, the charges having a given polarity,
wherein the MOS transistor circuit includes:
a charge accumulation portion that is electrically connected with the photoelectric conversion layer;
a reset transistor that resets a potential of the charge accumulation portion to a reset potential;
an output transistor that outputs a signal corresponding to the potential of the charge accumulation portion, and
a protective circuit that is electrically connected with the charge accumulation portion and prevent the potential of the charge accumulation potential from exceeding a predetermined voltage,
the reset transistor and the output transistor have carriers whose polarity is opposite to the given polarity,
wherein following formula (1) is satisfied:

$$GND < Vs < GND + \Delta V2 + (Vdd/5) \qquad (1)$$

where GND denote a reference potential of all potentials, Vs denote the reset potential of the reset transistor, and $\Delta V2$ denote a difference between a first potential of the charge accumulation portion in a case where the reset transistor is in its ON state and a second potential of the charge accumulation portion immediately after the reset transistor has turned from its ON state into its OFF state and Vdd is a power source voltage of the solid-state imaging device.

2. A solid-state imaging device comprising:
a photoelectric conversion layer that is formed over a semiconductor substrate; and
a MOS transistor circuit that reads out a signal corresponding to charges generated in the photoelectric conversion layer and then collected, and that is formed in the semiconductor substrate, the charges having a given polarity,
wherein the MOS transistor circuit includes:
a charge accumulation portion that is electrically connected with the photoelectric conversion layer;
a reset transistor that resets a potential of the charge accumulation portion to a reset potential;
an output transistor that outputs a signal corresponding to the potential of the charge accumulation portion, and
a protective circuit that is electrically connected with the charge accumulation portion and prevent the potential of the charge accumulation potential from exceeding a predetermined voltage,
the reset transistor and the output transistor have carriers whose polarity is opposite to the given polarity,
wherein following formula (2) is satisfied:

$$Vfd > (Vrg1 + \Delta V1) \qquad (2)$$

where Vrg1 denote a potential of a region of the semiconductor substrate underlying a gate electrode of the reset transistor in a case where the reset transistor is in its OFF state, $\Delta V1$ denote a critical potential at which leak-out of the charges from the charge accumulation portion into a reset power source of the reset transistor does not occur in the OFF state of the reset transistor, and Vfd denote the second potential, and $\Delta V1$ is further a voltage difference between the second potential Vfd and the potential Vrg1.

3. The solid-state imaging device according to claim 2, wherein following formula (3) is satisfied:

$$Vrg2 > Vs \qquad (3)$$

where Vrg2 denote a potential of the region of the semiconductor substrate underlying the gate electrode of the reset transistor in a case where the reset transistor is in its ON state, the following relationship holds, and a threshold voltage of the reset transistor is within a range which satisfies the formulas (1) to (3).

4. The solid-state imaging device according to claim 2, wherein following formula (4) is satisfied:

$$(Vrg1 + \Delta V1 - Vdd) < Vth < (Vrg1 + \Delta V1)$$

where Vdd denote a power source voltage of the output transistor, and Vth denote a threshold voltage of the output transistor.

5. The solid-state imaging device according to claim 3, wherein following formula (4) is satisfied:

$$(Vrg1 + \Delta V1 - Vdd) < Vth < (Vrg1 + \Delta V1)$$

where Vdd denote a power source voltage of the output transistor, and Vth denote a threshold voltage of the output transistor.

6. An imaging apparatus comprising a solid-state imaging device including:
a photoelectric conversion layer that is formed over a semiconductor substrate; and
a MOS transistor circuit that reads out a signal corresponding to charges generated in the photoelectric conversion layer and then collected, and that is formed in the semiconductor substrate, the charges having a given polarity,
wherein the MOS transistor circuit includes:
a charge accumulation portion that is electrically connected with the photoelectric conversion layer;
a reset transistor that resets a potential of the charge accumulation portion to a reset potential;
an output transistor that outputs a signal corresponding to the potential of the charge accumulation portion, and
a protective circuit that is electrically connected with the charge accumulation portion and prevent the potential of the charge accumulation potential from exceeding a predetermined voltage,
the reset transistor and the output transistor have carriers whose polarity is opposite to the given polarity,
wherein following formula (1) is satisfied:

$$GND < Vs < GND + \Delta V2 + (Vdd/5) \qquad (1)$$

where GND denote a reference potential of all potentials, Vs denote the reset potential of the reset transistor, and $\Delta V2$ denote a difference between a first potential of the charge accumulation portion in a case where the reset transistor is in its ON state and a second potential of the charge accumulation portion immediately after the reset transistor has turned from its ON state into its OFF state, and $\Delta V1$ is further a voltage difference between the second potential Vfd and the potential Vrg1.

7. An imaging apparatus comprising a solid-state imaging device including:
a photoelectric conversion layer that is formed over a semiconductor substrate; and
a MOS transistor circuit that reads out a signal corresponding to charges generated in the photoelectric conversion layer and then collected, and that is formed in the semiconductor substrate, the charges having a given polarity,
wherein the MOS transistor circuit includes:
- a charge accumulation portion that is electrically connected with the photoelectric conversion layer;
- a reset transistor that resets a potential of the charge accumulation portion to a reset potential;
- an output transistor that outputs a signal corresponding to the potential of the charge accumulation portion, and
- a protective circuit that is electrically connected with the charge accumulation portion and prevent the potential of the charge accumulation potential from exceeding a predetermined voltage, the reset transistor and the output transistor have carriers whose polarity is opposite to the given polarity,
wherein following formula (2) is satisfied:

$$Vfd > (Vrg1 + \Delta V1) \quad (2)$$

where Vrg1 denote a potential of a region of the semiconductor substrate underlying a gate electrode of the reset transistor in a case where the reset transistor is in its OFF state, $\Delta V1$ denote a critical potential at which leak-out of the charges from the charge accumulation portion into a reset power source of the reset transistor does not occur in the OFF state of the reset transistor, and Vfd denote the second potential, and $\Delta V1$ is further a voltage difference between the second potential Vfd and the potential Vrg1.

8. The imaging apparatus according to claim to claim 7, wherein following formula (3) is satisfied:

$$Vrg2 > Vs \quad (3)$$

where Vrg2 denote a potential of the region of the semiconductor substrate underlying the gate electrode of the reset transistor in a case where the reset transistor is in its ON state, the following relationship holds, and a threshold voltage of the reset transistor is within a range which satisfies the formulas (1) to (3).

9. The imaging apparatus according to claim 7, wherein following formula (4) is satisfied:

$$(Vrg1 + \Delta V1 - Vdd) < Vth < (Vrg1 + \Delta V1)$$

where Vdd denote a power source voltage of the output transistor, and Vth denote a threshold voltage of the output transistor.

10. The imaging apparatus according to claim 8, wherein following formula (4) is satisfied:

$$(Vrg1 + \Delta V1 - Vdd) < Vth < (Vrg1 + \Delta V1)$$

where Vdd denote a power source voltage of the output transistor, and Vth denote a threshold voltage of the output transistor.

* * * * *